(12) United States Patent
Jang et al.

(10) Patent No.: US 10,804,102 B2
(45) Date of Patent: Oct. 13, 2020

(54) FLEXIBLE DEVICE ON WHICH PATTERN OF 2-DIMENSIONAL MATERIAL IS FORMED AND MANUFACTURING METHOD THEREOF

(71) Applicant: SEOUL NATIONAL UNIVERSITY R&DB FOUNDATION, Seoul (KR)

(72) Inventors: Ho Won Jang, Seoul (KR); Yeonhoo Kim, Seoul (KR); Byung Hee Hong, Gyeonggi-do (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/274,375

(22) Filed: Feb. 13, 2019

(65) Prior Publication Data
US 2019/0326113 A1    Oct. 24, 2019

(30) Foreign Application Priority Data
Apr. 19, 2018   (KR) .................. 10-2018-0045761

(51) Int. Cl.
| H01L 21/02 | (2006.01) |
| H01L 21/3213 | (2006.01) |
| H01L 29/24 | (2006.01) |
| H01L 29/16 | (2006.01) |

(52) U.S. Cl.
CPC .. *H01L 21/02527* (2013.01); *H01L 21/02425* (2013.01); *H01L 21/02568* (2013.01); *H01L 21/3213* (2013.01); *H01L 29/1606* (2013.01); *H01L 29/24* (2013.01)

(58) Field of Classification Search
CPC .......... H01L 21/02527; H01L 29/1606; H01L 21/02425; H01L 29/24; H01L 21/02568; H01L 21/3213; H01L 21/7806
See application file for complete search history.

(56) References Cited

U.S. PATENT DOCUMENTS

| 10,263,136 | B1* | 4/2019 | Yoo | H01L 21/02444 |
| 2012/0049239 | A1* | 3/2012 | Sung | H01L 51/5206 257/103 |
| 2013/0285016 | A1* | 10/2013 | Wei | H01L 29/1606 257/26 |
| 2014/0077161 | A1* | 3/2014 | Duan | H01L 29/4958 257/29 |
| 2014/0329050 | A1* | 11/2014 | Gu | B82Y 20/00 428/135 |
| 2015/0104623 | A1* | 4/2015 | Hong | B82Y 10/00 428/195.1 |
| 2018/0248019 | A1* | 8/2018 | Robinson | H01L 29/66742 |

FOREIGN PATENT DOCUMENTS

KR    10-1694529    1/2017

* cited by examiner

*Primary Examiner* — Karen Kusumakar

(57) ABSTRACT

The present disclosure provides a method for manufacturing a flexible device having a pattern of a two-dimensional material formed thereon includes: a step of forming a two-dimensional material layer on a substrate; a step of forming a pattern of the two-dimensional material; a step of coating a flexible substrate solution on the patterned two-dimensional material layer and curing the same; and a step of removing the substrate.

14 Claims, 3 Drawing Sheets

FLEXIBLE DEVICE ON WHICH PATTERN OF 2-DIMENSIONAL MATERIAL IS FORMED AND MANUFACTURING METHOD THEREOF

CROSS-REFERENCE TO RELATED APPLICATION

This application claims priority of Korean Patent Application No. 10-2018-0045761, filed on Apr. 18, 2018, in the KIPO (Korean Intellectual Property Office), the disclosure of which is incorporated herein entirely by reference.

BACKGROUND OF THE INVENTION

Field of the Invention

The present disclosure relates to a flexible device having a pattern of a two-dimensional material formed thereon and a method for manufacturing the same, more particularly to a micro- or nano-pattern of a two-dimensional material such as graphene formed on a flexible substrate constituting a flexible device, and a method for manufacturing the same.

Description of the Related Art

Recently, as the interests in wearable devices, etc. utilizing flexible devices are increasing, two-dimensional materials are researched actively. The two-dimensional material refers to a material with a size of several nanometers (nm) in which small atoms are arranged in a single layer. Graphene is a typical example.

In general, graphite is a structure in which layers of carbon atoms arranged in a honeycomb lattice are stacked. The individual layers are called graphene. Graphene, which has a thickness of 0.2 nm, has high physical and chemical stability, conducts electricity 100 times or higher than copper, and exhibits electron mobility 100 times or faster than silicon. Also, it is transparent and has excellent flexibility. As such, a flexible device fabricated by pattering a two-dimensional material such as graphene can be used in wide applications such as semiconductors, gas sensors, displays, Internet of things, smart sensors, etc.

In order to use the two-dimensional material, it is very important to realize a desired pattern on a target substrate. But, for a flexible substrate, it is difficult to realize a desired pattern (particularly, a micro- or nano-pattern) by the common lithography process on the flexible substrate after transferring a two-dimensional material due to the material characteristics of the flexible substrate. As the conventional method of transferring a two-dimensional material pattern, a method of coating PMMA (polymethyl methacrylate) on a patterned two-dimensional material and then transferring the same to a target substrate by floating on water has been used, for example. However, there are problems in that the surface is distorted or unstable and the yield of nano or micro pattering of graphene is very low.

SUMMARY OF THE INVENTION

The present disclosure is designed to solve the above-described problems of the related art and is directed to providing a micro-pattern or nano-pattern of a two-dimensional material formed on a flexible substrate and a facile method of manufacturing a flexible device on which a two-dimensional material is patterned.

In an aspect of the present disclosure, a method for manufacturing a flexible device having a pattern of a two-dimensional material formed thereon includes: a step of forming a two-dimensional material layer on a substrate; a step of forming a pattern of the two-dimensional material; a step of coating a flexible substrate solution on the patterned two-dimensional material layer and curing the same; and a step of removing the substrate.

In an exemplary embodiment of the present disclosure, the step of forming the pattern of the two-dimensional material may include a step of forming a micro-pattern or a nano-pattern of the two-dimensional material through a photolithography or e-beam lithography process.

In an exemplary embodiment of the present disclosure, the substrate may be a metal substrate made of a transition metal.

In an exemplary embodiment of the present disclosure, the substrate may be a metal substrate made of copper or nickel.

In an exemplary embodiment of the present disclosure, the step of removing the substrate may include a step of removing the metal substrate containing copper or nickel with ammonium persulfate, an aqueous $FeCl_3$ solution or a strong acid.

In an exemplary embodiment of the present disclosure, the method may further include a thermal lamination step after the formation of the flexible substrate.

In an exemplary embodiment of the present disclosure, the two-dimensional material may include graphene or a transition metal dichalcogenide (TMD).

In another aspect, the present disclosure provides a flexible device containing a pattern of a two-dimensional material, wherein a micro-pattern or a nano-pattern of a two-dimensional material is formed on a flexible substrate.

In an exemplary embodiment of the present disclosure, the two-dimensional material may include graphene or TMD, and the flexible substrate may be one selected from a group consisting of polyimide (PI), acryl, polycarbonate, polyvinyl alcohol, polyacrylate, polyethylene naphthalate (PEN), polyethylene terephthalate (PET), polynorbornene and polyethersulfone (PES).

The technology according to the various exemplary embodiments of the present disclosure allows formation of a very small two-dimensional material pattern of nanometer to micrometer scales on a flexible substrate through the common lithography process. In addition, the technology provided by the present disclosure allows manufacturing of a flexible substrate on which a two-dimensional material such as graphene is patterned through a relatively simple process and with a reasonable yield. Through this, a flexible device that can be utilized for semiconductors, sensors, wearable devices, flexible displays, etc. can be produced economically.

The effects that can be achieved with the present disclosure is not limited to those described above and other additional effects not described above will be clearly understood by those having ordinary skill in the related art to which the present disclosure belongs from the following description.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
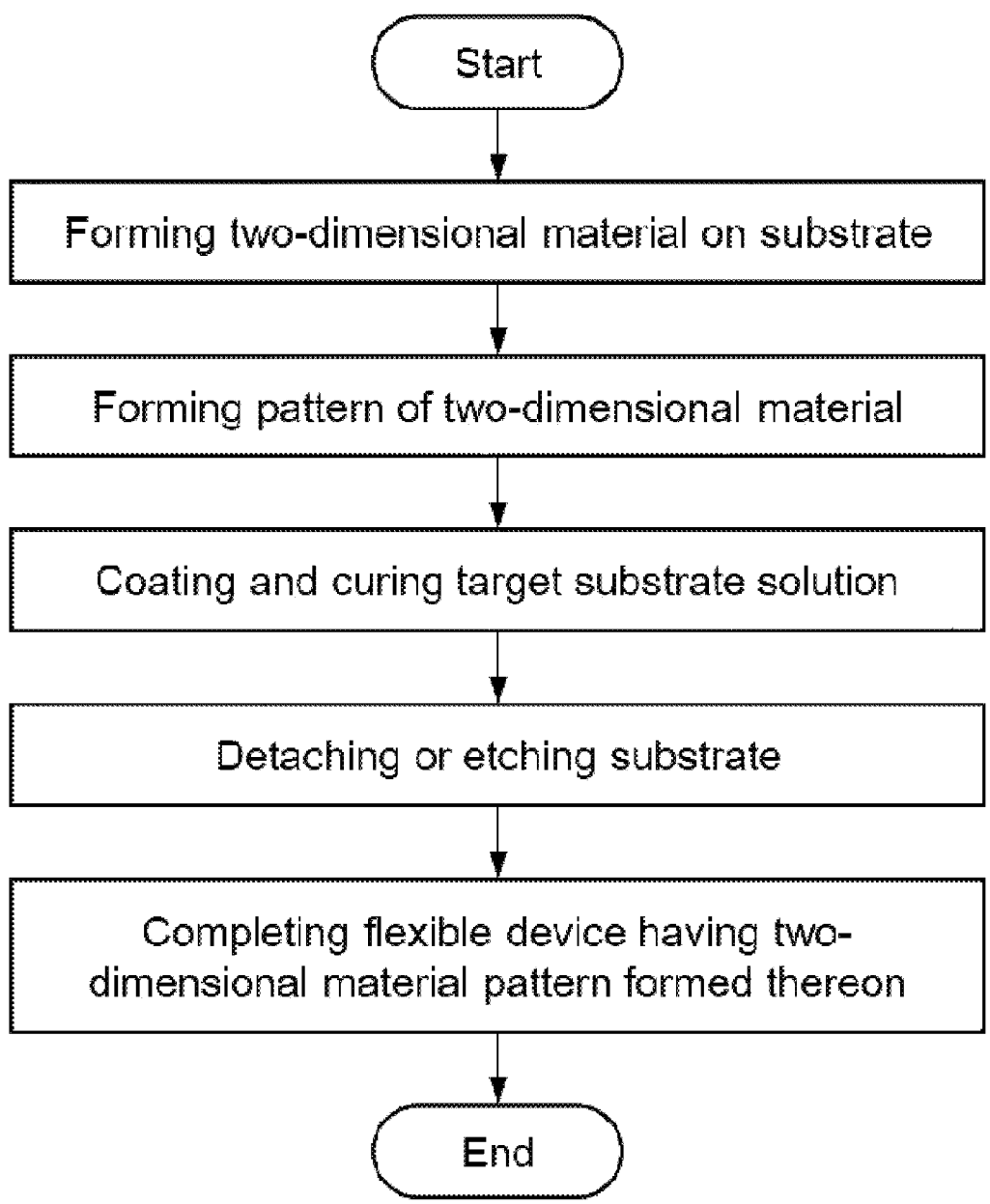
FIG. 1 is a flow chart illustrating a method for manufacturing a flexible device having a pattern of a two-dimensional material formed thereon according to an exemplary embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 4:
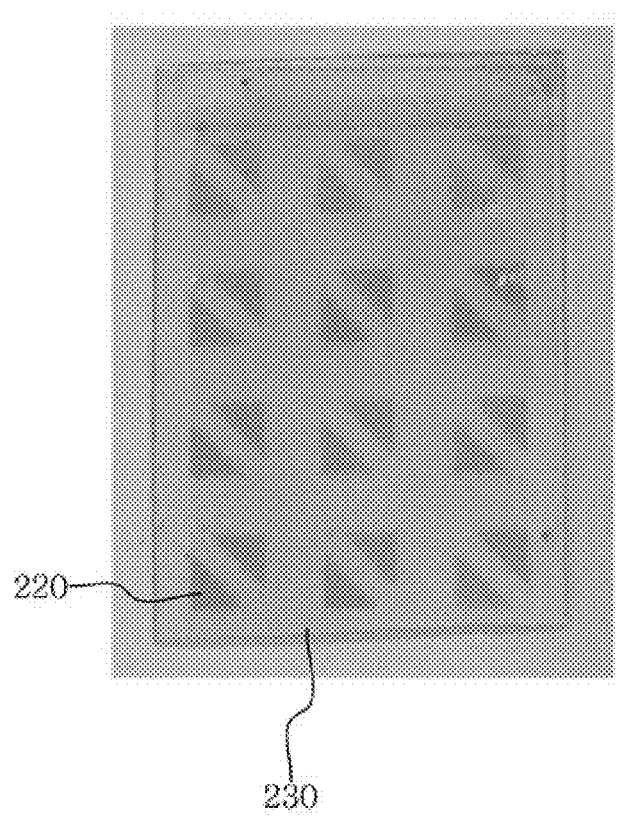
FIG. 4 shows a flexible substrate onto which a two-dimensional material pattern is transferred according to an exemplary embodiment of the present disclosure.

The present disclosure relates to a flexible substrate having a patterned two-dimensional material formed thereon. As shown in FIG. 4, it relates to a method for forming a patterned two-dimensional material 220 (e.g., graphene) formed on a flexible substrate 230.

Hereinafter, specific exemplary embodiments of the present disclosure are described referring to the attached drawings. Although the present disclosure is described referring to the exemplary embodiments illustrated in the drawings, they are provided only as specific examples and the technical idea and scope of the present disclosure are not limited by them.

FIG. 1 is a flow chart illustrating a method for manufacturing a flexible device having a pattern of a two-dimensional material 220 formed thereon according to an exemplary embodiment of the present disclosure. And, FIG. 2 illustrates individual steps of the method for manufacturing a flexible device having a pattern of a two-dimensional material 220 formed thereon according to an exemplary embodiment of the present disclosure.

Figure 2:
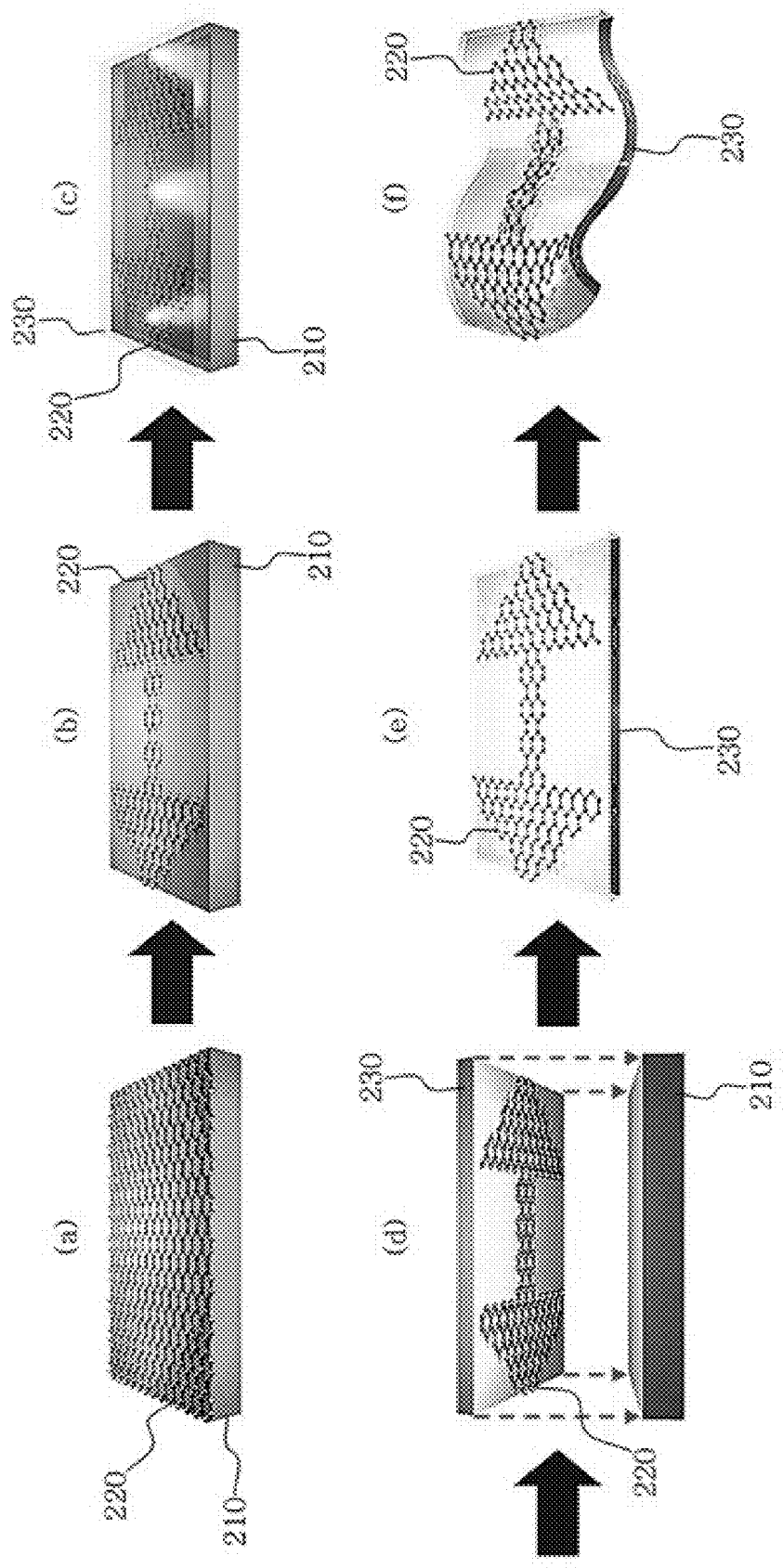
FIG. 2 illustrates individual steps of a method for manufacturing a flexible device having a pattern of a two-dimensional material formed thereon according to an exemplary embodiment of the present disclosure.

Specifically, referring to FIG. 1 and FIG. 2, the method for manufacturing a flexible device having a pattern of a two-dimensional material formed thereon according to an exemplary embodiment of the present disclosure includes a step of forming a two-dimensional material on a substrate (S110), a step of forming a pattern of the two-dimensional material (S120), a step of coating a target substrate solution and curing the same (S130), a step of detaching or etching the substrate (S140) and a step of completing a flexible device having a two-dimensional material pattern formed thereon (S150).

First, a two-dimensional material 220 is formed on a substrate 210 (S110). As shown in FIG. 2 (a), the two-dimensional material 220 may be grown directly on the substrate 210. In an exemplary embodiment of the present disclosure, the substrate 210 may be a metal thin film formed of a transition metal such as copper (Cu) and nickel (Ni) or a silicon (Si) or silica ($SiO_2$)-based substrate. When manufacturing the flexible device according to the present disclosure, the substrate 210 is not necessarily limited to a metal thin film or a hard substrate and any type of substrate may be used if a two-dimensional material can be patterned on the substrate. The two-dimensional material may be a graphene-based material such as graphene, hexagonal boron nitride (h-BN), BCN, fluorographene, graphene oxide, etc., a two-dimensional chalcogenide compound such as a transition metal dichalcogenide (TMD), a transition metal trichalcogenide (TMT), a metal phosphorous trichalcogenide (MPT), a metal monochalcogenide (MMC), etc, a two-dimensional oxide or phosphorus-based material such as black phosphorus, phosphorene, i.e. a single two-dimensional atomic layer of black phosphorus, various metal oxide nanosheets, etc. The exemplary embodiments of the present disclosure are not limited to the substrate material and two-dimensional material described above and various modifications may be made as desired. For example, graphene may be grown on a copper substrate 210 by chemical vapor deposition (CVD).

Next, a pattern of the two-dimensional material 220 is formed on the substrate 210 (S120). As shown in FIG. 2 (b), the two-dimensional material 220 formed on the substrate 210 may be patterned to a desired shape. For example, the two-dimensional material 220 may be patterned by a common photolithography or e-beam lithography process or may be elaborately micro- or nano-patterned. For a flexible substrate, it is difficult to pattern the two-dimensional material 220 after transferring due to its material characteristics and micro- or nano-patterning is almost impossible. Therefore, a flexible substrate having a two-dimensional material of a desired pattern formed thereon may be obtained by pattering (e.g., micro- or nano-patterning) the two-dimensional material 220 formed on the substrate 210 in the preceding step (S110) by a common lithography process and then transferring the patterned two-dimensional material 220 to a flexible substrate 230. The shape of the pattern of the two-dimensional material is not limited to that shown in FIG. 2 (b) and micro- or nano-patterns of various shapes may be formed.

Subsequently, a target substrate solution is coated and cured (S130). That is to say, as shown in FIG. 2 (c), a flexible substrate (target substrate) solution is coated on the two-dimensional material 220 patterned on the substrate 210 and then cured to form a flexible substrate 230 on the patterned two-dimensional material 220. The flexible substrate may be formed of a flexible polymer material and may have a transparent property. For example, the flexible substrate may be one selected from a group consisting of polyimide (PI), acryl, polycarbonate, polyvinyl alcohol, polyacrylate, polyethylene naphthalate (PEN), polyethylene terephthalate (PET), polynorbornene and polyethersulfone (PES).

Next, the substrate 210 is removed by detaching or etching the same (S140). As seen from FIG. 2 (d), the substrate layer 210 is removed while retaining the cured flexible substrate 230 and the patterned two-dimensional material layer 220 through a detachment or etching process. For example, a copper (Cu) thin film substrate 210 may be etched using an ammonium persulfate (APS) solution, a $FeCl_3$ solution, etc. and a nickel (Ni) substrate 210 may be removed with a strong acid such as $HNO_3$, etc.

Finally, a flexible device is completed using the flexible substrate 230 having the pattern of the two-dimensional material 220 formed (S150). As seen from FIGS. 2 (e) and (f), the flexible substrate 230 with the substrate 210 removed contains the patterned two-dimensional material 220. Through this method, a micro- or nano-patterned flexible device can be manufactured despite the material characteristics of the flexible substrate 230.

In another exemplary embodiment of the present disclosure, after the formation of the flexible substrate 230, a supporting substrate may be formed by a thermal lamination process, etc. to ensure the stability of the substrate.

Figure 3:
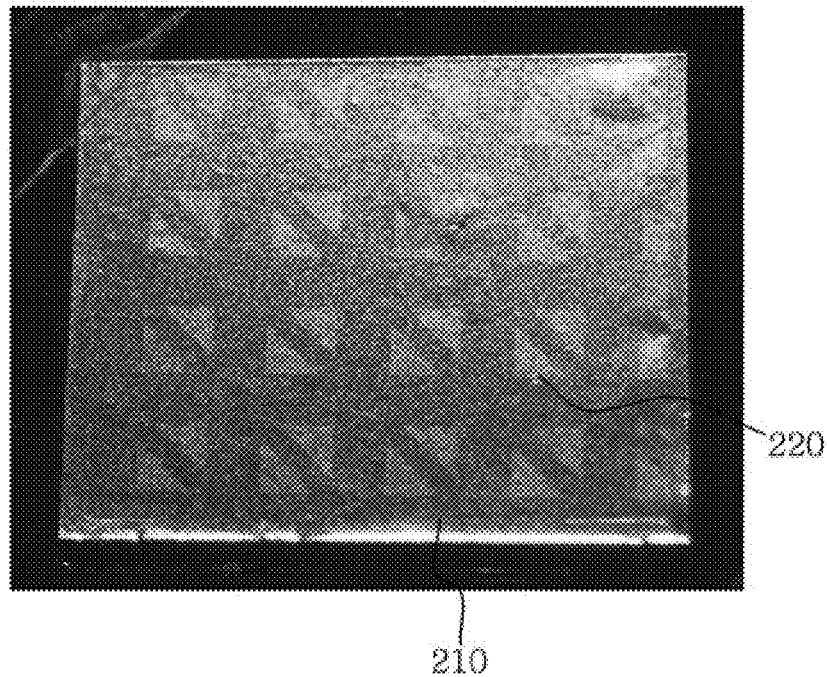
FIG. 3 shows a two-dimensional material pattern formed on a substrate according to an exemplary embodiment of the present disclosure.

FIG. 3 shows a pattern of a two-dimensional material 220 formed on a substrate 210 according to an exemplary embodiment of the present disclosure.

FIG. 3 shows an image of the two-dimensional material 220 (e.g., graphene) which has been grown on the substrate 210 (e.g., copper (Cu) foil) and then micro-patterned with a desired shape. Because the two-dimensional material 220 grown on the substrate 210 is patterned directly, micro- or nano-patterning is possible even with the general lithography process.

FIG. 4 shows a flexible substrate onto which a two-dimensional material pattern is transferred according to an exemplary embodiment of the present disclosure.

FIG. 4 shows an image of the patterned two-dimensional material 220 (e.g., graphene) which has been transferred to the flexible substrate 230. Because the patterned two-dimensional material 220 is transferred from the substrate 210 to the flexible substrate 230, micro- or nano-patterning is possible and the flexible substrate 230 having the pattern of the two-dimensional material 220 can be obtained conveniently.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method for manufacturing a flexible device having a pattern of a two-dimensional material formed thereon, comprising:
   a step of forming a two-dimensional material layer on a substrate;
   a step of forming a pattern of the two-dimensional material;
   a step of coating a flexible substrate solution on the patterned two-dimensional material layer and curing the same; and
   a step of removing the substrate,
   wherein the flexible substrate solution is one selected from a group consisting of polyimide (PI), acryl, polycarbonate, polyvinyl alcohol, polyacrylate, polyethylene naphthalate (PEN), polyethylene terephthalate (PET), polynorbornene and polyethersulfone (PES).

2. The method for manufacturing a flexible device of claim 1, wherein the step of forming the pattern of the two-dimensional material comprises a step of forming a micro-pattern or a nano-pattern of the two-dimensional material through a photolithography or e-beam lithography process.

3. The method for manufacturing a flexible device of claim 1, wherein the substrate is a metal substrate made of a transition metal.

4. The method for manufacturing a flexible device of claim 3, wherein the substrate is a metal substrate made of copper or nickel.

5. The method for manufacturing a flexible device of claim 4, wherein the step of removing the substrate comprises a step of removing the metal substrate comprising copper or nickel with ammonium persulfate, an aqueous $FeCl_3$ solution or a strong acid.

6. The method for manufacturing a flexible device of claim 1, further comprising a thermal lamination step after the formation of the flexible substrate.

7. The method for manufacturing a flexible device of claim 1, wherein the two-dimensional material comprises graphene or a transition metal dichalcogenide (TMD).

8. A method for manufacturing a flexible device having a pattern of a two-dimensional material formed thereon, comprising:

forming a two-dimensional material layer on a substrate;

patterning the two-dimensional material in a desired shape;

coating a flexible substrate solution on the patterned two-dimensional material layer; and removing the substrate, wherein the flexible substrate solution is one selected from a group consisting of polyimide (PI), acryl, polycarbonate, polyvinyl alcohol, polyacrylate, polyethylene naphthalate (PEN), polyethylene terephthalate (PET), polynorbornene and polyethersulfone (PES).

9. The method for manufacturing a flexible device of claim 8, wherein the step of patterning comprises a step of forming a micro-pattern or a nano-pattern of the two-dimensional material through a photolithography or e-beam lithography process.

10. The method for manufacturing a flexible device of claim 8, wherein the substrate is a metal substrate made of a transition metal.

11. The method for manufacturing a flexible device of claim 10, wherein the substrate is a metal substrate made of copper or nickel.

12. The method for manufacturing a flexible device of claim 11, wherein the step of removing comprises a step of removing the metal substrate comprising copper or nickel with ammonium persulfate, an aqueous $FeCl_3$ solution or a strong acid.

13. The method for manufacturing a flexible device of claim 8, further comprising thermal laminating after the formation of the flexible substrate.

14. The method for manufacturing a flexible device of claim 8, wherein the two-dimensional material comprises graphene or a transition metal dichalcogenide (TMD).

\* \* \* \* \*